US010276182B2

(12) United States Patent
Otani et al.

(10) Patent No.: US 10,276,182 B2
(45) Date of Patent: Apr. 30, 2019

(54) SOUND PROCESSING DEVICE AND NON-TRANSITORY COMPUTER-READABLE STORAGE MEDIUM

(71) Applicant: FUJITSU LIMITED, Kawasaki-shi, Kanagawa (JP)

(72) Inventors: Takeshi Otani, Kawasaki (JP); Taro Togawa, Kawasaki (JP); Sayuri Nakayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 77 days.

(21) Appl. No.: 15/666,722

(22) Filed: Aug. 2, 2017

(65) Prior Publication Data

US 2018/0061434 A1 Mar. 1, 2018

(30) Foreign Application Priority Data

Aug. 30, 2016 (JP) ................................. 2016-168593

(51) Int. Cl.
*G10L 21/02* (2013.01)
*G10L 21/0232* (2013.01)
(Continued)

(52) U.S. Cl.
CPC ........ *G10L 21/0232* (2013.01); *G10K 11/178* (2013.01); *G10L 21/0208* (2013.01);
(Continued)

(58) Field of Classification Search
CPC combination set(s) only.
See application file for complete search history.

(56) References Cited

U.S. PATENT DOCUMENTS 3,038,119 A * 6/1962 Billig et al. ........... G01R 29/26
324/614
7,315,816 B2 * 1/2008 Gotanda ............. G10L 21/0208
702/196

(Continued)

FOREIGN PATENT DOCUMENTS

| JP | 2005-077731 | 3/2005 |
| JP | 2007-219479 | 8/2007 |
| JP | 2009-020471 | 1/2009 |
| JP | 2010-193213 A | 9/2010 |
| WO | WO 2007/018293 A1 | 2/2007 |

OTHER PUBLICATIONS

Extended European Search Report dated Feb. 1, 2018 in Patent Application No. 17184905.2, 9 pages.
Mariko Aoki, et al. "Sound source segregation based on estimating incident angle of each frequency component of input signals acquired by multiple microphones", Acoustical Society of Japan, Acoustical Science and Technology, vol. 22, No. 2, XP008073215, 2001, pp. 149-157.

*Primary Examiner* — Abul K Azad
(74) *Attorney, Agent, or Firm* — Xsensus LLP

(57) ABSTRACT

A sound processing device includes a processor configured to generate a first frequency spectrum of a first sound signal corresponding to a first sound received at a first input device and a second frequency spectrum of a second sound signal corresponding to the first sound received at a second input device, calculate a transfer characteristic based on a first difference between an intensity of the first frequency spectrum and an intensity of the second frequency spectrum, generate a third frequency spectrum of a third sound signal transmitted from the first input device and a fourth frequency spectrum of a fourth sound signal transmitted from the second input device, specify a suppression level of an intensity of the fourth frequency spectrum based on a second difference between an intensity of the third frequency spectrum and an intensity of the fourth frequency spectrum.

17 Claims, 8 Drawing Sheets

(51) Int. Cl.
   *G10K 11/178*   (2006.01)
   *H04R 3/00*     (2006.01)
   *G10L 21/0208*  (2013.01)
   *G10L 21/0272*  (2013.01)
   *H03G 3/32*     (2006.01)
   *H03G 5/16*     (2006.01)
   G10L 21/0216    (2013.01)
   G10L 21/0316    (2013.01)

(52) U.S. Cl.
   CPC .......... *G10L 21/0272* (2013.01); *H03G 3/32* (2013.01); *H03G 5/165* (2013.01); *H04R 3/005* (2013.01); *G10K 2210/3045* (2013.01); *G10K 2210/30232* (2013.01); *G10L 21/0316* (2013.01); *G10L 2021/02087* (2013.01); *G10L 2021/02161* (2013.01); *H04R 2430/03* (2013.01)

(56) References Cited

U.S. PATENT DOCUMENTS

| | | | |
|---|---|---|---|
| 8,352,249 B2* | 1/2013 | Chong | G10L 19/008 704/200 |
| 8,676,571 B2* | 3/2014 | Otani | G10L 21/0208 381/56 |
| 2009/0055170 A1 | 2/2009 | Nagahama | |
| 2009/0306973 A1 | 12/2009 | Hiekata et al. | |

* cited by examiner

SOUND PROCESSING DEVICE AND NON-TRANSITORY COMPUTER-READABLE STORAGE MEDIUM

CROSS-REFERENCE TO RELATED APPLICATION

This application is based upon and claims the benefit of priority of the prior Japanese Patent Application No. 2016-168593, filed on Aug. 30, 2016, the entire contents of which are incorporated herein by reference.

FIELD

The embodiments discussed herein are related to a sound processing device and a non-transitory computer-readable storage medium.

BACKGROUND

There is a growing demand for sound recognition and sound analysis, so that a technology is desired by which a sound that a speaker has uttered is accurately analyzed. As a technology of the sound analysis, there is a method called binary masking. In the binary masking, frequency analysis is performed on sounds obtained through a plurality of input devices, and the sizes of signal levels are compared with each other for each frequency component, and the input of a target sound having a large signal level and the input of a non-target sound having a small signal level are identified, and the non-target sound is removed to perform analysis of the target sound. Japanese Laid-open Patent Publication No. 2009-20471 is the related art.

SUMMARY

According to an aspect of the invention, a sound processing device configured to be coupled to a first input device and a second input device, the sound processing device includes a memory and a processor coupled to the memory and configured to generate a first frequency spectrum of a first sound signal corresponding to a first sound received at the first input device and a second frequency spectrum of a second sound signal corresponding to the first sound received at the second input device, calculate a transfer characteristic based on a first difference between an intensity of the first frequency spectrum and an intensity of the second frequency spectrum, generate a third frequency spectrum of a third sound signal transmitted from the first input device and a fourth frequency spectrum of a fourth sound signal transmitted from the second input device, specify a suppression level of an intensity of the fourth frequency spectrum based on a second difference between an intensity of the third frequency spectrum and an intensity of the fourth frequency spectrum, and the transfer characteristic, and suppress the intensity of the fourth frequency spectrum using the specified suppression level.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
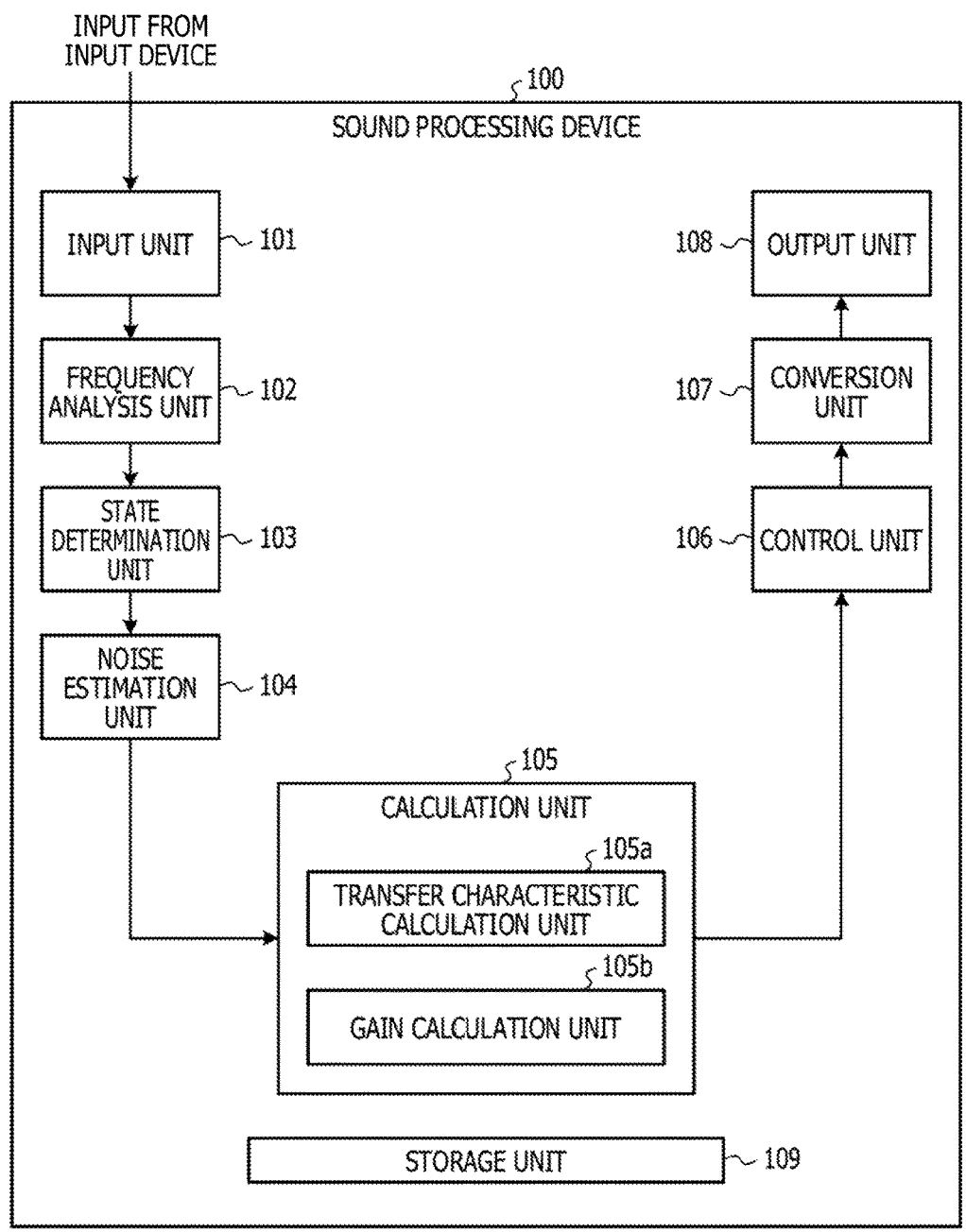
FIG. 1 is a diagram illustrating a configuration example of a sound processing device according to a first embodiment.

When a surrounding environment is changed, separation accuracy of the target sound and the non-target sound may be reduced because a change occurs in the frequency spectrums of the sounds, and the sizes of the target sound and the non-target sound are reversed, and as a result, the sound analysis may not be performed successfully.

A sound processing device 100 according to a first embodiment is described below with reference to drawings.

The sound processing device 100 according to the first embodiment performs frequency analysis on sound signals received from two input devices and generates frequency spectrums corresponding to the sound signals. The sound processing device 100 compares signals levels of the calculated frequency spectrums for each frequency, and determines a sound input state based on the comparison result. That is, the sound processing device 100 determines whether the sound input state is a state in which the input mainly corresponds to a sound from one of the input devices or a state in which the input corresponds to sounds from the two input devices. For example, in a case in which the input devices are respectively placed near two speakers, when the sound input state is a state in which the input is biased toward a sound from one of the input devices, the sound processing device 100 determines that a speaker near the corresponding input device is in a speech state, and when sounds having the same level are input from the two input devices, the sound processing device 100 determines that the two speakers are in the speech state. Sounds from a plurality of speakers may correspond to a single input device and be received at the input device.

When the sound processing device 100 determines that the sound input state is the state in which the input mainly corresponds to a sound from one of the input devices (here, a first input device), the sound processing device 100 obtains a transfer characteristic (first transfer characteristic $(H_{12}=X2*X1^{-1})$) based on a frequency spectrum (X1) generated for the input from the input device and a frequency spectrum (X2) generated for the input from the other input device (here, a second input device), and stores the transfer characteristic in a storage unit. The sound processing device 100 may calculate a transfer characteristic between the devices based on a single sound source received through the two input devices in advance, store the transfer characteristic, and execute the above-described processing based on the stored transfer characteristic. Alternatively, when the sound processing device 100 determines that the input mainly corresponds to a sound from the other input device, the sound processing device 100 obtains a transfer characteristic (second transfer characteristic ($H_{21}=X1*X2^{-1}$)) based on the frequency spectrum (X2) generated for the input from the other input device and the frequency spectrum (X1) generated for the input from the input device, and stores the transfer characteristic in the storage unit. The sound processing device 100 may obtain power spectrums based on the frequency spectrums, and obtain a transfer characteristic based on the power spectrums. In this case also, the transfer characteristic is obtained based on the frequency spectrums.

After that, when the sound processing device 100 has determined that the sound input state is the state in which the input corresponds to sounds from the two input devices, the sound processing device 100 compares the frequency spectrum corresponding to the sound signal input to the first input device from among the two input devices with a frequency spectrum obtained by applying the transfer characteristic ($H_{21}$) stored in the storage unit to the frequency spectrum corresponding to the sound signal input to the second input device. The sound processing device 100 calculates a suppression amount of the frequency spectrum corresponding to the sound input to the first input device, based on a comparison result of the frequency spectrums. That is, for each of the frequencies, the sound processing device 100 compares the frequency spectrum corresponding to the sound signal input to the first input device with the frequency spectrum obtained by applying the transfer characteristic to the frequency spectrum corresponding to the sound signal input to the second input device, and controls the suppression amount so that the suppression amount becomes larger as the difference is small.

The sound processing device 100 may execute sound processing in accordance with a transfer characteristic including an effect of the surrounding environment in which the input devices are located by the above-described processing.

FIG. 1 is a diagram illustrating a configuration example of the sound processing device 100 according to the first embodiment.

The sound processing device 100 according to the first embodiment includes an input unit 101, a frequency analysis unit 102, a state determination unit 103, a noise estimation unit 104, a calculation unit 105, a control unit 106, a conversion unit 107, an output unit 108, and a storage unit 109. The calculation unit 105 includes a transfer characteristic calculation unit 105a and a gain calculation unit 105b.

In this example, the input unit 101 receives sounds from two input devices (microphones). The input unit 101 converts the received sounds into sound signals by an analog-to-digital converter. It may be assumed that the input unit 101 receives signals on which analog/digital conversion has been already performed.

The frequency analysis unit 102 converts the sound signal digitalized in the input unit 101 into a sound spectrum. The frequency analysis unit 102 divides the sound signal digitalized in the input unit 101 into frames each having a specific length T (for example, 10 msec). In addition, the frequency analysis unit 102 performs frequency analysis on the sound signal for each of the frames. The frequency analysis unit 102 performs spectrum conversion on the sound signal, for example, through short time Fourier transform (STFT). However, a method in which a sound signal is converted into a frequency is not limited to the above-described method. In addition, the frequency analysis unit 102 calculates a power spectrum for each of the frequencies from the frequency spectrum signal for each of the frames.

The state determination unit 103 determines whether the sound input state is a state in which the input mainly corresponds to a sound signal from one of the devices or a state in which the input corresponds to sound signals from the two inputs devices from among the sound signals accepted from the two input devices. For example, the state determination unit 103 compares the sound levels of the frequency spectrums received from the two input devices for each of the frequencies, and determines whether the input corresponds to the sound signal from one of the devices or corresponds to the sound signals from the two input devices, based on the magnitude relation between the sound levels. Specifically, the state determination unit 103 performs the determination based on a ratio of a frequency having a sound level larger than that of the other input device to all of the frequencies. The sound processing device 100 determines that the sound input state is a state in which the input mainly corresponds to the sound from one of the devices when the calculated ratio is larger than a first ratio or smaller than a second ratio (first ratio>second ratio) and determines that the input corresponds to the sounds from the two input devices in other cases (when the calculated ratio is the second ratio or more and the first ratio or less).

The noise estimation unit 104 estimates a noise spectrum included in the frequency spectrum calculated in the frequency analysis unit 102. The noise spectrum is a spectrum corresponding to a signal detected by an input device when a sound signal is not input to the input device. As the method in which a noise spectrum is calculated, for example, there is a spectrum subtraction method. However, a calculation method of a noise spectrum by the noise estimation unit 104 is not limited to the above-described spectrum subtraction method. In addition, the noise estimation unit 104 calculates a power spectrum of a noise for each of the frequencies by executing processing similar to the processing executed in the frequency analysis unit. The noise power spectrum may be utilized for calculation of a gain, which is described later.

The transfer characteristic calculation unit 105a of the calculation unit 105 calculates a transfer characteristic based on the sizes of the frequency spectrums received from the two input devices when it is determined that the input corresponds to the sound signal from one of the devices as a result of the determination in the state determination unit 103.

The gain calculation unit 105b of the calculation unit 105 calculates, for each of the frequencies, a gain (adjustment amount for suppression) for the sound spectrum corresponding to the sound signal input from each of the input devices, based on the power spectrum of the sound signal received from the input device in the input unit 101, the determination result in the state determination unit 103, and the transfer function calculated in the transfer characteristic calculation unit 105a. In addition, the gain calculation unit 105b calculates a smoothing gain by smoothing a gain in the current frame and a gain in the frame one-frame before the current frame using a smoothing function.

The control unit 106 calculates an output spectrum based on the frequency spectrum of the sound signal received from the input device in the input unit 101 and the smoothing gain calculated in the gain calculation unit 105b.

The conversion unit 107 converts the output spectrum into an output signal through short time Fourier inverse transform.

The output unit 108 outputs the output signal converted in the conversion unit 107.

The storage unit 109 stores pieces of information calculated in the function units and pieces of information related to the pieces of processing. Specifically, the storage unit 109 stores, as appropriate, pieces of information desired for execution of the pieces of processing in the function units such as the sounds input from the input devices, the sound signals converted in the input unit 101, the frequency spectrums analyzed in the frequency analysis unit 102, the power spectrums, the determination result in the state determination unit 103, the frequency spectrums and the power spectrums estimated in the noise estimation unit 104, the transfer characteristic, the gains, and the smoothing gains calculated in the calculation unit 105, the output spectrums calculated in the control unit 106, and the output signals converted in the conversion unit 107.

Figure 2:
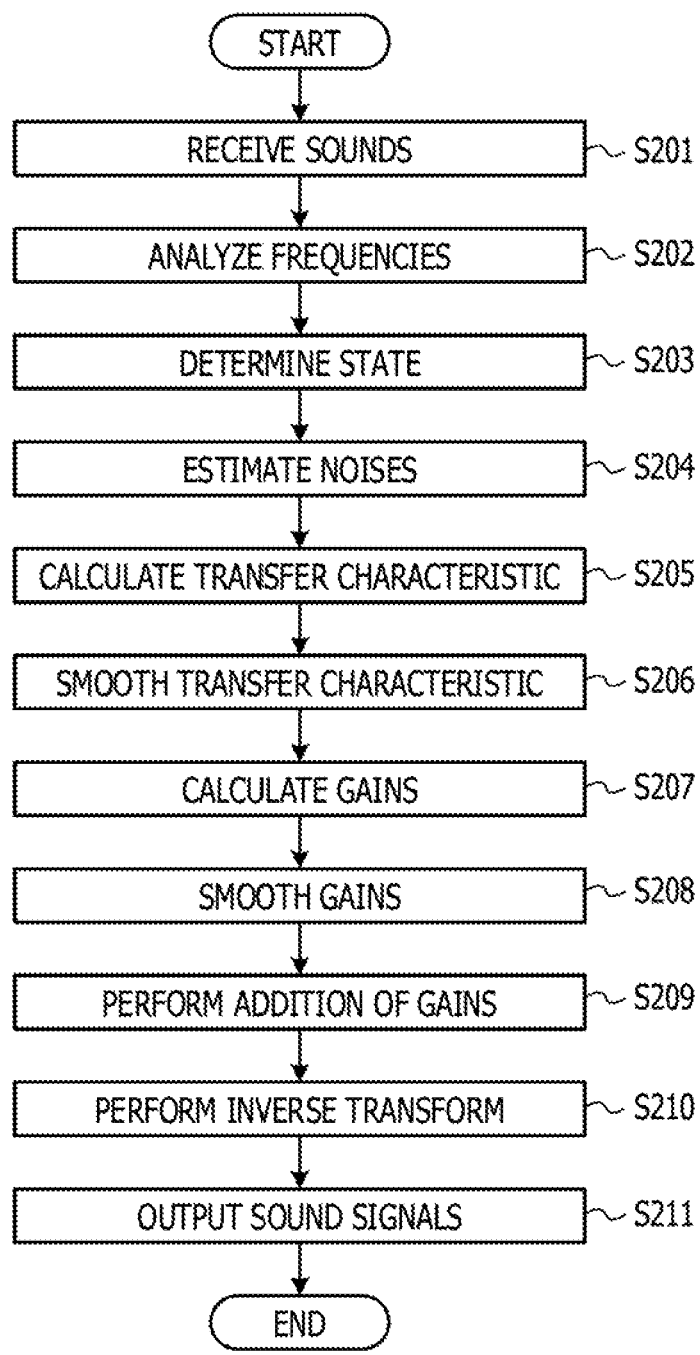
FIG. 2 is a diagram illustrating a processing flow of the sound processing device according to the first embodiment.

A processing flow of the sound processing device 100 according to the first embodiment is described below. FIG. 2 is a diagram illustrating the processing flow of the sound processing device 100 according to the first embodiment.

For example, processing to be executed when there are two input devices, a sound signal $x_1(t)$ is received from a first input device, and a sound signal $x_2(t)$ is received from a second input device is described below.

In the sound processing device 100 according to the first embodiment, after the input unit 101 receives the sound signals $x_1(t)$ and $x_2(t)$ from the input devices (Step S201), the frequency analysis unit 102 calculates frequency spectrums $X_1(f)$ and $X_2(f)$ by performing frequency analysis on the sound signals $x_1(t)$ and $x_2(t)$, respectively (Step S202). Here, "f" indicates a frequency. For the method of frequency analysis, for example, the short time Fourier transform in the description of the frequency analysis unit 102 is used. In addition, the frequency analysis unit 102 of the sound processing device 100 calculates power spectrums $P_{X1}(f)$ and $P_{X2}(f)$ for each of the frequencies from the frequency spectrum signals for each of the frames. A formula used when the sound spectrums are converted into the power spectrums is represented in (mathematical expression 1).

$$P_{X1}(f)=10\cdot\log_{10}|X_1(f)|^2$$

$$P_{X2}(f)=10\cdot\log_{10}|X_2(f)|^2 \quad \text{(Mathematical expression 1)}$$

Next, the state determination unit 103 of the sound processing device 100 determines whether the sound input state is a state in which the input mainly corresponds to a sound signal from one of the input devices or a state in which the input corresponds to sound signals from the two input devices from among the sound signals accepted from the two input devices (Step S203). The state determination unit 103 compares the sound levels of the frequency spectrum of the sound signal input to the first input device and the frequency spectrum of the sound signal input to the second input device for each of the frequencies, and identifies a frequency in which the level of the sound spectrum input to the first input device is larger than the level of the sound spectrum input to the second input device. The state determination unit 103 determines the input corresponds to a sound signal from the first input device (the first input device is active) when a ratio of the frequency in which the level of the sound spectrum input to the first input device is larger than the level of the sound spectrum input to the second input device to all of the frequencies to which the comparison has been performed is larger than a first ratio, and determines the input corresponds to a sound signal from the second input device (the second input device is active) when the ratio is smaller than a second ratio (first ratio>second ratio). The ratio of the frequency in which the level of the sound spectrum input to the first input device is larger than the level of the sound spectrum input to the second input device is the second ratio or more and the first ratio or less, the state determination unit 103 determines that the sound input state is a state in which the input corresponds to the sound signals from the two input devices.

The noise estimation unit 104 of the sound processing device 100 calculates noise spectrums $N_1(f)$ and $N_2(f)$ included in the sound spectrums analyzed in the frequency analysis unit 102, for example, by the spectrum subtraction method. In addition, the noise estimation unit 104 executes processing similar the case in which the frequency spectrums have been converted into the power spectrums in the above-described frequency analysis unit 102 to calculate noise power spectrums $P_{N1}(f)$ and $P_{N2}(f)$ (Step S204). A formula used when the noise spectrums are converted to the noise power spectrums is represented in (mathematical expression 2).

$$P_{N1}(f)=10\cdot\log_{10}|N_1(f)|^2$$

$$P_{N2}(f)=10\cdot\log_{10}|N_2(f)|^2 \quad \text{(Mathematical expression 2)}$$

The noise power spectrums obtained here are utilized for calculating gains.

Next, the transfer characteristic calculation unit 105a of the sound processing device 100 calculates a transfer characteristic based on the sound spectrums corresponding to the sound signals received at the input unit 101, the determination result of the state determination unit 103, and the sound levels input to the first input device and the second input device (Step S205). When the state determination unit 103 determines that the input corresponds to an input signal from one of the devices, the transfer characteristic calculation unit 105a of the sound processing device 100 calculates a transfer function. When the sound level of the frequency spectrum $X_1(f)$ of the sound signal received from the first input device is larger than the sound level of the frequency spectrum $X_2(f)$ of the sound signal received from the second input device, the transfer characteristic calculation unit 105a calculates a transfer characteristic $H_{12}(t,f)$ of the power spectrum of the sound signal received from the second input device for the power spectrum of the sound signal received from the first input device. A formula used when the transfer characteristic $H_{12}(t,f)$ is calculated is represented in (mathematical expression 3).

$$H_{12}(t,f)=P_{X2}(f)-P_{X1}(f) \quad \text{(Mathematical expression 3)}$$

After the transfer characteristic calculation unit 105a of the sound processing device 100 calculates the transfer characteristic $H_{12}(t,f)$, the transfer characteristic calculation unit 105a smooths the transfer characteristic $H_{12}(t,f)$ between frames and calculates a smoothing transfer characteristic (Step S206). Due to the smoothing, even when a noise suddenly occurs in a certain frame, and a large change occurs in the original transfer characteristic, the influence may be suppressed. A formula used when the transfer characteristic calculation unit 105a calculates the smoothing transfer characteristic is represented in (mathematical expression 4).

$$\overline{H_{12}(t,f)}=\alpha\cdot\overline{H_{12}(t-1,f)}+(1-\alpha)\cdot H_{12}(t,f) \quad \text{(Mathematical expression 4)}$$

In addition, in a case in which the input corresponds to an input signal from one of the devices as a result of the determination in the state determination unit 103, when the sound level of the frequency spectrum of the sound signal received from the second input device is larger than the sound level of the frequency spectrum of the sound signal received from the first input device, the transfer characteristic calculation unit 105a calculates a transfer characteristic $H_{21}(t,f)$ of the power spectrum of the sound signal received from the first input device for the power spectrum of the sound signal received from the second input device and the smoothing transfer characteristic, in accordance with the following formulas represented in (mathematical expression 5) and (mathematical expression 6).

$$H_{21}(t,f)=P_{X1}(f)-P_{X2}(f) \quad \text{(Mathematical expression 5)}$$

$$\overline{H_{21}(t,f)}=\alpha \cdot \overline{H_{21}(t-1,f)}+(1-\alpha) \cdot H_{21}(t,f) \quad \text{(Mathematical expression 6)}$$

However, the smoothing of the transfer characteristic may not be performed, and for example, the processing may be omitted when a large change in the sound does not occur between the frames.

After that, in the sound processing device 100, the gain calculation unit 105b calculates suppression gains Gn(t,f) (Step S207). The gain calculation unit 105b calculates the suppression gains Gn(t,f) depending on the active states of the sounds from the plurality of input devices. A method in which the active state is determined is executed, for example, based on the information determined in the state determination unit 103. A calculation formula of the gains Gn(t,f) used when the first input device is active is represented in (mathematical expression 7).

$$G_1(t,f)=0$$

$$G_2(t,f)=P_{X2}(f)-P_{N2}(f) \quad \text{(Mathematical expression 7)}$$

Next, a calculation formula of the gains Gn(t,f) used when the second input device is active is represented in (mathematical expression 8).

$$G_1(t,f)=P_{X1}(f)-P_{N1}(f)$$

$$G_2(t,f)=0 \quad \text{(Mathematical expression 8)}$$

The sound processing device 100 obtains the gain for the sound from the inactive input device as a difference between the power spectrum of the input signal and the power spectrum of the noise signal because the sound from the inactive input device is reduced to the level of the noise signal to execute the sound processing.

Figure 3:
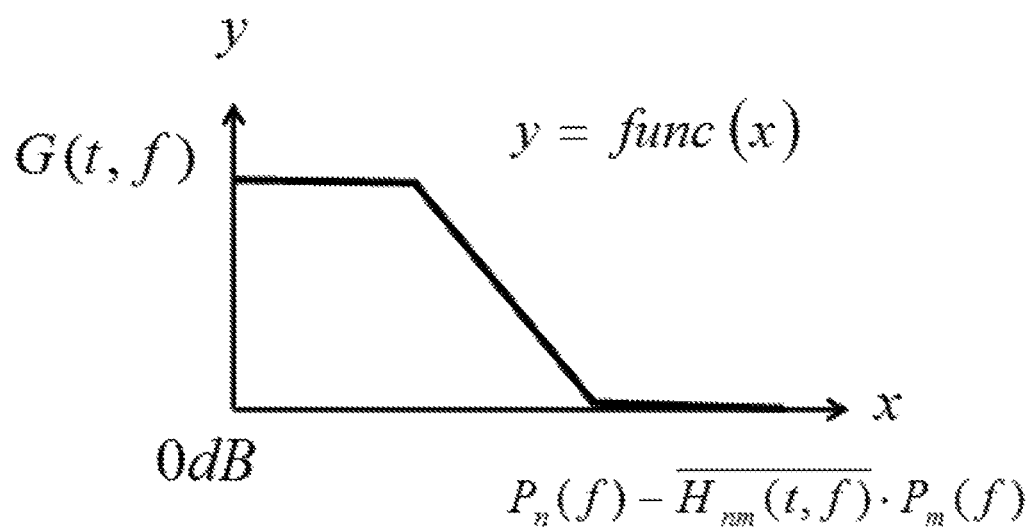
FIG. 3 is a diagram illustrating an example of a suppression gain calculation function.

In the sound processing device 100, when the input corresponds to input signals from the two input devices as a result of the state determination in the state determination unit 103, the gain calculation unit 105b calculates gains using the function illustrated in FIG. 3. FIG. 3 is a diagram illustrating an example of a suppression gain calculation function. However, FIG. 3 is merely an example, and the processing may be executed using another function. A formula used when the gains Gn(t,f) are calculated is represented in (mathematical expression 9).

$$G_1(t,f)=\text{func}(P_1(f)-\overline{H_{21}(t,f)} \cdot P_2(f))$$

$$G_2(t,f)=\text{func}(P_2(f)-\overline{H_{12}(t,f)} \cdot P_1(f)) \quad \text{(Mathematical expression 9)}$$

A reason why the function as illustrated in FIG. 3 is used is described below.

When a level difference for each of the frequency components between the sound spectrum input to the first input device and the sound spectrum obtained by adding the transfer characteristic to the sound spectrum input to the second input device is small, it is highly probable that the sound input to the first input device corresponds to the sound input from the second input device. Therefore, it is desirable to suppress the sound spectrum input to the first input device, so that the suppression amount increases. In addition, when the level difference between the sound spectrums is large, it is highly probable that the input corresponds to the sound not from the second input device but from the first input device, so that the suppression amount is reduced.

After that, the gain calculation unit 105b of the sound processing device 100 calculates smoothing gains based on the suppression gains (Step S208). A formula used when the smoothing gains are calculated is represented in (mathematical expression 10).

$$\overline{G_1(t,f)}=\beta \cdot \overline{G_1(t-1,f)}+(1-\beta) \cdot G_1(t,f)$$

$$\overline{G_2(t,f)}=\beta \cdot \overline{G_2(t-1,f)}+(1-\beta) \cdot G_2(t,f) \quad \text{(Mathematical expression 10)}$$

The control unit 106 of the sound processing device 100 suppresses the frequency spectrums corresponding to the sounds in each of which the input has been accepted from the input device using the smoothing gain calculated in the gain calculation unit 105b (Step S209). A formula used when the addition of the gains is performed, and output spectrums $Y_1(f)$ and $Y_2(f)$ are calculated is represented in (mathematical expression 11).

$$Y_1(f) = 10^{\overline{G_1(t,f)}/20} \cdot X_1(f) \quad \text{(Mathematical expression 11)}$$

$$Y_2(f) = 10^{\overline{G_2(t,f)}/20} \cdot X_2(f)$$

In addition, the conversion unit 107 of the sound processing device 100 calculates output sound signals $y_1(t)$ and $y_2(t)$ by performing short time Fourier inverse transform on the output spectrums $Y_1(f)$ and $Y_2(f)$ on which the suppression has been performed (Step S210).

The output unit 108 of the sound processing device 100 outputs the output sound signals $y_1(t)$ and $y_2(t)$ converted in the conversion unit 107 (Step S211), and the processing ends.

A sound processing device 100 according to the second embodiment is described below.

The sound processing device 100 according to the second embodiment executes processing when sound signals have been received from three input devices. In a case in which the sound processing device 100 executes the sound processing according to the second embodiment, when suppression of the sound is performed based on a gain having a larger value from among gains calculated based on transfer characteristics between a plurality of devices, further accurate sound analysis may be performed.

Figure 4:
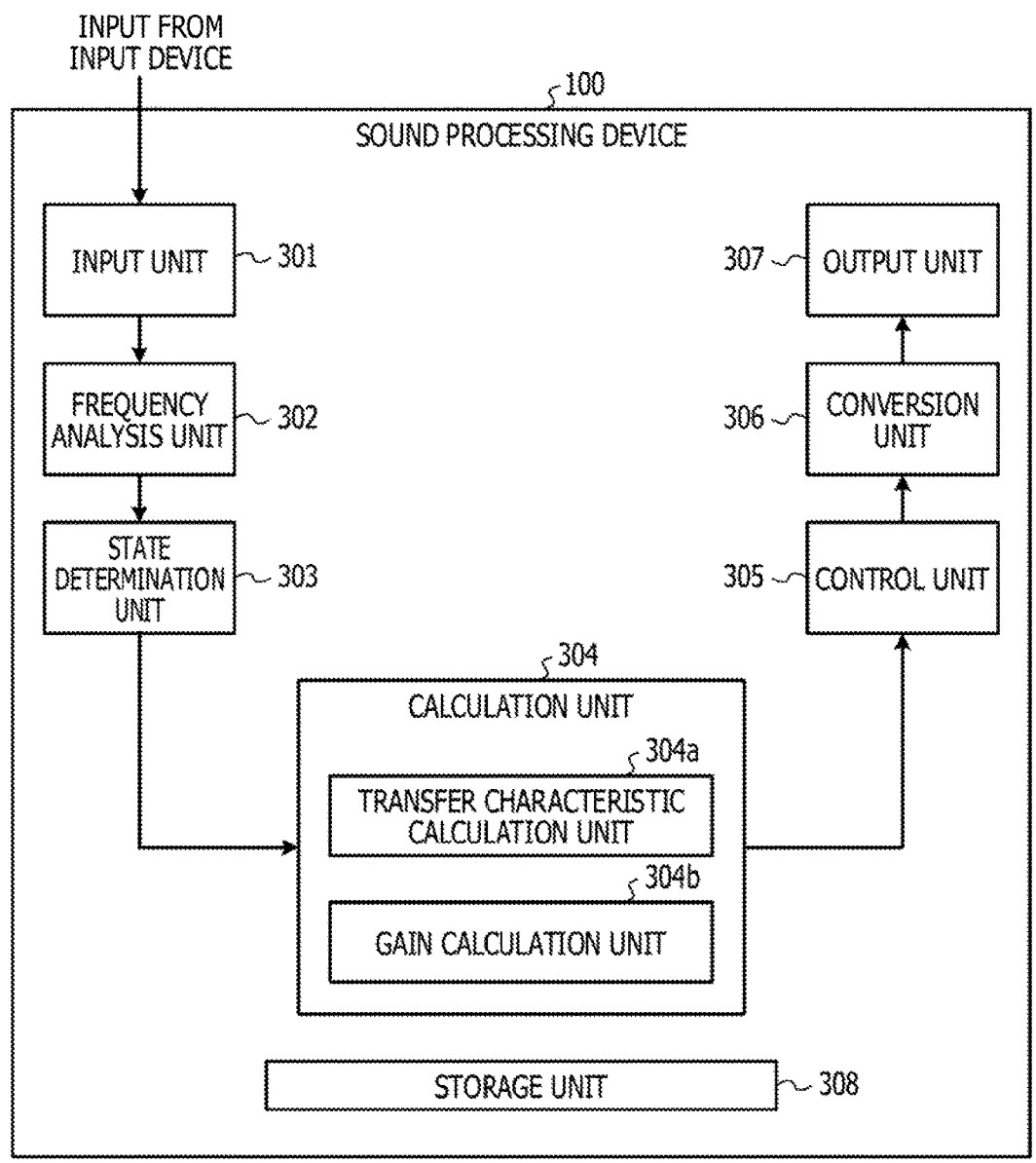
FIG. 4 is a diagram illustrating a configuration example of a sound processing device according to a second embodiment.

FIG. 4 is a diagram illustrating a configuration example of the sound processing device 100 according to the second embodiment.

The sound processing device 100 according to the second embodiment includes an input unit 301, a frequency analysis unit 302, a state determination unit 303, a calculation unit 304, a control unit 305, a conversion unit 306, an output unit 307, and a storage unit 308, and the calculation unit 304 includes a transfer characteristic calculation unit 304a and a gain calculation unit 304b. The input unit 301, the frequency analysis unit 302, the transfer characteristic calculation unit 304a, the control unit 305, the conversion unit 306, the output unit 307, and the storage unit 308 respectively execute pieces of processing similar to those of the function units in the configuration of the sound processing device 100 according to the first embodiment.

The state determination unit 303 executes processing similar to that of the first embodiment and determines whether the sound input state is a state in which the input mainly corresponds to a sound signal received from one of devices or a state in which the input corresponds to sound signals received from a plurality of (two or three) devices.

The state determination unit 303 determines that a certain input device is active when a ratio of a frequency in which the level of the sound spectrum input to the certain input device is larger than the levels of the sound spectrums input to the other input devices to all frequencies to which the comparison has been performed is larger than a first ratio, and determines that the input corresponds to sound signals from the plurality of input devices when the ratio is smaller than the first ratio.

Similarly to the first embodiment, the gain calculation unit 304b calculates suppression gains depending on the speech state determined in the state determination unit 303. In the second embodiment, suppression gains are calculated depending on the activity of the sounds input from the three input devices. In addition, the gain calculation unit 304b assigns weights to the gains using a weight function.

Figure 5:
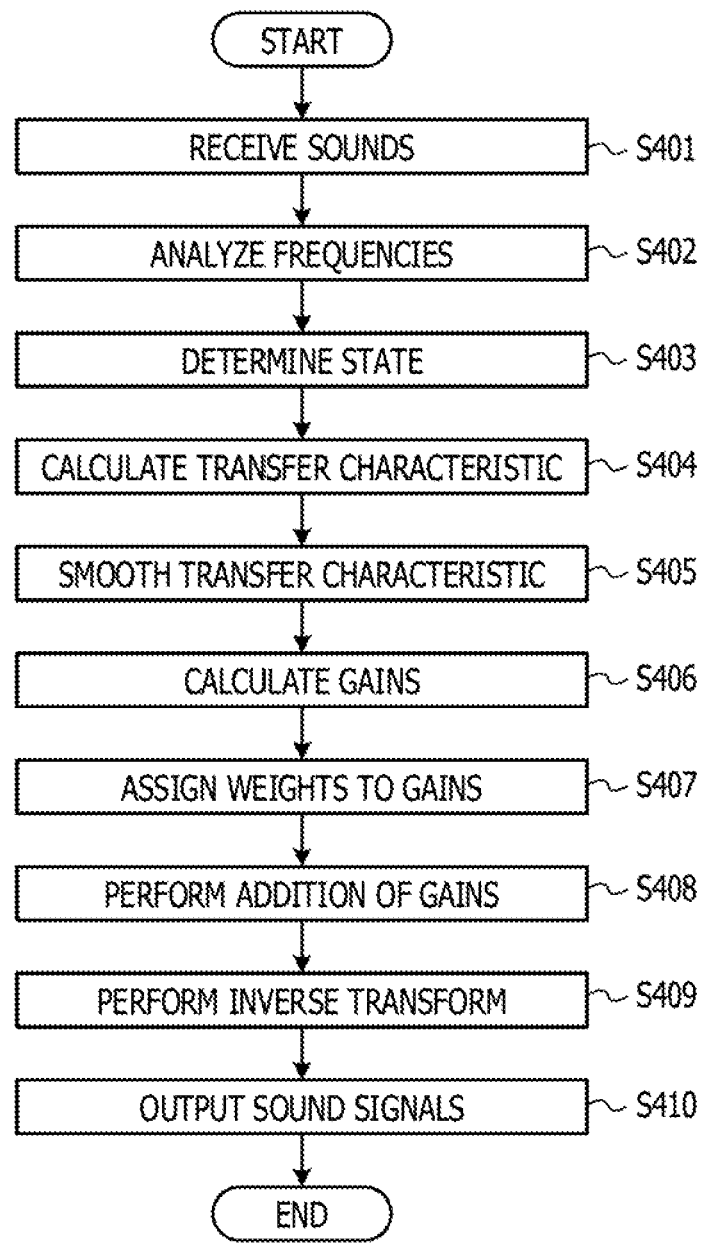
FIG. 5 is a diagram illustrating a processing flow of the sound processing device according to the second embodiment.

A processing flow of the sound processing device 100 according to the second embodiment is described below. FIG. 5 is a diagram illustrating the processing flow of the sound processing device 100 according to the second embodiment.

For example, processing executed when there are three input devices, and a sound signal $x_1(t)$ is received from a first input device, a sound signal $x_2(t)$ is received from a second input device, and a sound signal $x_3(t)$ is received from a third input device is described below.

In the sound processing device 100 according to the second embodiment, after the input unit 301 receives sound signals from the input devices (Step S401), the frequency analysis unit 302 performs frequency analysis on the sound signals $x_1(t)$, $x_2(t)$, and $x_3(t)$ to calculate frequency spectrums $X_1(f)$, $X_2(f)$, and $X_3(f)$ (Step S402). Here, "f" indicates a frequency. For the method of the frequency analysis, for example, the short time Fourier transform in the description of the frequency analysis unit 302 is used. In addition, the frequency analysis unit 302 of the sound processing device 100 calculates power spectrums $P_{X1}(f)$ and $P_{X2}(f)$, and $P_{X3}(f)$ for each frequency from the spectrum signals for each frame. A formula used when the sound spectrums are converted in the power spectrums is represented in (mathematical expression 12).

$P_1(f)=10 \cdot \log_{10}|X_1(f)|^2$ $P_2(f)=10 \cdot \log_{10}|X_2(f)|^2$ $P_3(f)=10 \cdot \log_{10}|X_2(f)|^2$ (Mathematical expression 12)

Next, the state determination unit 303 of the sound processing device 100 determines whether the input mainly corresponds to a sound from one of the input devices or corresponds to sounds from the plurality of devices from among the sounds input to the input devices, from the frequency spectrums of the sound signals received from the input devices (Step S403).

The transfer characteristic calculation unit 304a of the sound processing device 100 calculates a transfer characteristic based on the levels and the active states of the sounds input to the first input device, the second input device, and the third input device (Step S404), and smooths the transfer characteristic based on the calculated transfer characteristic (Step S405). The calculation method and the smoothing method of the transfer characteristic are similar to those of the first embodiment.

In a case in which the speech state determined in the state determination unit 303 corresponds to a single speaker, when the sound level of the frequency spectrum of the sound signal received from the first input device is larger than the sound levels of the frequency spectrums of the sound signals received from the second input device and the third input device, the gain calculation unit 304b of the sound processing device 100 sets gains Gn(t,f) as represented in (mathematical expression 13) (Step S406).

$G_1(t,f)=0$ $G_2(t,f)=G_3(t,f)=15$ dB (Mathematical expression 13)

In a case in which the speech state determined in the state determination unit 303 corresponds to a single speaker, when the sound signals received from the second input device and the third input device are active, the gain calculation unit 304b of the sound processing device 100 calculates gains Gn(t,f) as represented in (mathematical expression 14) and (mathematical expression 15), similar to the above-described (mathematical expression 13).

$G_1(t,f)=G_3(t,f)=15$ dB $G_2(t,f)=0$ dB (Mathematical expression 14)

$G_1(t,f)=G_2(t,f)=15$ dB $G_3(t,f)=0$ dB (Mathematical expression 15)

In the above-described formula, it is assumed that the suppression gain for the sound spectrum from an inactive input device is uniformly set at 15 dB, but the suppression gain may not be set at 15 dB, and may be set depending on the surrounding environment.

Figure 6:
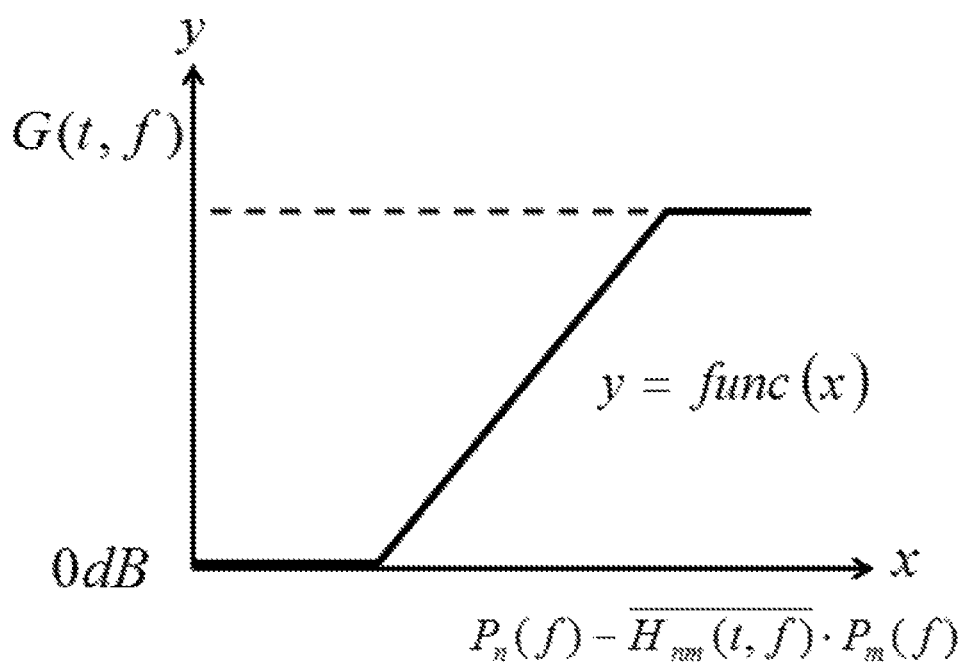
FIG. 6 is a diagram illustrating an example of a suppression gain calculation function.

When the speech state determined in the state determination unit 303 corresponds to a plurality of speakers, the gain calculation unit 304b of the sound processing device 100 calculates suppression gains Gn(t,f), based on the function illustrated in FIG. 6, using the power spectrums calculated in the frequency analysis unit 302 and the transfer characteristics between the input devices. FIG. 6 is a diagram illustrating an example of a suppression gain calculation function. Formulas used when suppression gains of the first input device, the second input device, and the third input device are calculated are respectively represented in (mathematical expression 16), (mathematical expression 17), and (mathematical expression 18), $G_{12}(t,f)=\text{func}(P_2(f)-\overline{H_{12}(t,f)} \cdot P_1(f))$ $G_{13}(t,f)=\text{func}(P_3(f)-\overline{H_{13}(t,f)} \cdot P_1(f))$ $G_1(t,f)=\max(G_{12}(t,f), G_{13}(t,f))$ (Mathematical expression 16)

$G_{21}(t,f)=\text{func}(P_2(f)-\overline{H_{22}(t,f)} \cdot P_2(f))$ $G_{23}(t,f)=\text{func}(P_3(f)-\overline{H_{23}(t,f)} \cdot P_2(f))$ $G_2(t,f)=\max(G_{22}(t,f), G_{23}(t,f))$ (Mathematical expression 17)

$G_{31}(t,f)=\text{func}(P_1(f)-\overline{H_{31}(t,f)} \cdot P_3(f))$ $G_{32}(t,f)=\text{func}(P_2(f)-\overline{H_{23}(t,f)} \cdot P_2(f))$ $G_2(t,f)=\max(G_{21}(t,f), G_{23}(t,f))$ (Mathematical expression 18)

Figure 7:
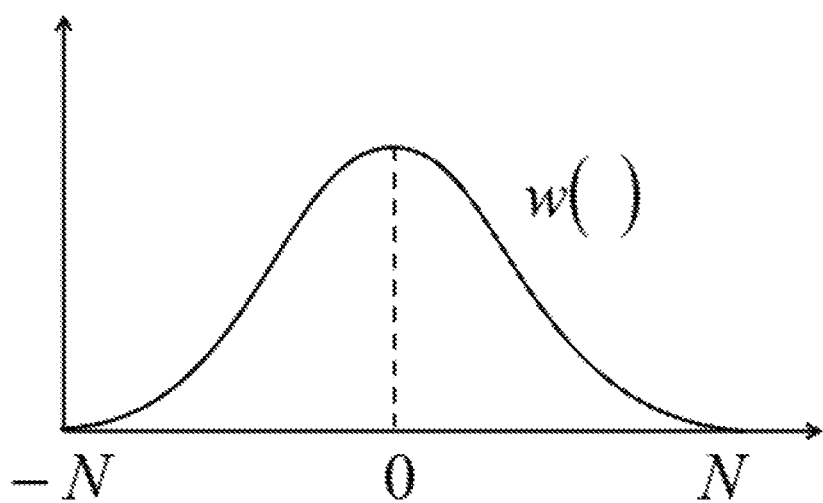
FIG. 7 is a diagram illustrating an example of a weight function.

After that, the gain calculation unit 304b assigns weights to gains of a plurality of frequencies based on a weight function (Step S407). A formula used when the weights are assigned to the gains is represented in (mathematical expression 19). The gain calculation unit 304b performs the calculation, for example, using the function as illustrated in the graph of FIG. 7 as the weight function. FIG. 7 is a diagram illustrating an example of the weight function.

$$\overline{G_1(t,f)} = \sum_{k=-N}^{N} (w(k) \cdot G_1(t, f+k))$$ (Mathematical expression 19)

$$\overline{G_2(t,f)} = \sum_{k=-N}^{N} (w(k) \cdot G_2(t, f+k))$$

$$\overline{G_3(t,f)} = \sum_{k=-N}^{N} (w(k) \cdot G_3(t, f+k))$$

It is assumed that the weight function illustrated in FIG. 7 satisfies the following condition of (mathematical expression 20), $$\sum_{k=-N}^{N} (w(k)) = 1$$ (Mathematical expression 20)

$$0 < w(k) < 1$$

In the sound processing device 100, the control unit 305 adds the suppression gains, to which the weights calculated in the gain calculation unit 304b have been assigned, to the frequency spectrums corresponding to sounds input from the plurality of input devices (Step S408). A formula used when the addition of the gains is performed, and output spectrums Yn(f) are calculated is represented in (mathematical expression 21).

$$Y_1(f) = 10^{\overline{G_1(t,f)}/20} \cdot X_1(f)$$ (Mathematical expression 21)

$$Y_2(f) = 10^{\overline{G_2(t,f)}/20} \cdot X_2(f)$$

$$Y_3(f) = 10^{\overline{G_3(t,f)}/20} \cdot X_3(f)$$

In addition, the conversion unit 306 of the sound processing device 100 calculates output sound signals $y_1(t)$ and $y_2(t)$, and $y_3(t)$ by performing the short time Fourier inverse transform on the output spectrums $Y_1(f)$, Y2(f), and $Y_3(f)$ on which the suppression has been performed (Step S409). The output unit 307 of the sound processing device 100 outputs the output sound signals $y_1(t)$ and $y_2(t)$, and $y_3(t)$ converted in the conversion unit 306 (Step S410), and the processing end.

Figure 8:
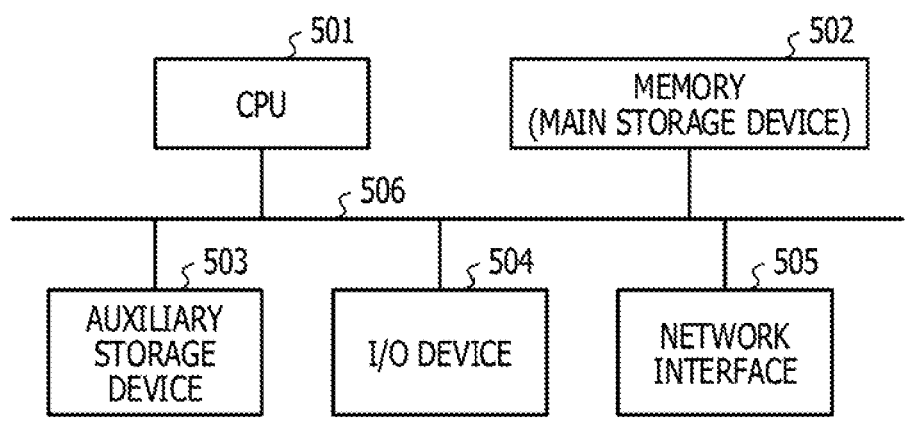
FIG. 8 is a diagram illustrating a hardware configuration example of the sound processing device.

Next, described is a hardware configuration example of the sound processing device 100 according to the first and second embodiments. FIG. 8 is a diagram illustrating the hardware configuration example of the sound processing device 100. As illustrated in FIG. 8, in the sound processing device 100, a central processing unit (CPU) 501, a memory (main storage device) 502, an auxiliary storage device 503, an I/O device 504, and a network interface 505 are coupled to each other through a bus 506.

The CPU 501 is a calculation processing device that controls the whole operation of the sound processing device 100 and controls the pieces of processing of the functions of the frequency analysis unit, the noise estimation unit, the calculation unit, and the like, according to the first and second embodiments.

The memory 502 is a storage unit that stores, in advance, a program such as an operating system (OS) that controls the operation of the sound processing device 100, and is used as a work area as appropriate when the program is executed, and includes, for example, a random access memory (RAM) and a read only memory (ROM).

The auxiliary storage device 503 is, for example, a storage device such as a hard disk and a flash memory, and is a device that stores various control programs executed by the CPU 501, obtained data, and the like.

The I/O device 504 accepts input of a sound from an input device, an instruction for the sound processing device 100 through an input device such as a mouse and a keyboard, and input of a value set by the user, and the like. In addition, through the I/O device 504, the frequency spectrum or the like on which the suppression has been performed is output to an external sound output unit and a display image generated based on data stored in the storage unit is output to a display.

The network interface 505 is an interface device that manages the exchange of various pieces of data with external devices through a wired or a wireless communication.

The bus 506 is a communication path through which the above-described devices are coupled to each other, and pieces of data are exchanged between the devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A sound processing device configured to be coupled to a first input device and a second input device, the sound processing device comprising:
   a memory; and
   a processor coupled to the memory and configured to
     generate a first frequency spectrum of a first sound signal corresponding to a first sound received at the first input device and a second frequency spectrum of a second sound signal corresponding to the first sound received at the second input device,
     calculate a transfer characteristic based on a first difference between an intensity of the first frequency spectrum and an intensity of the second frequency spectrum,
     generate a third frequency spectrum of a third sound signal transmitted from the first input device and a fourth frequency spectrum of a fourth sound signal transmitted from the second input device,
     specify a suppression level of an intensity of the fourth frequency spectrum based on a second difference between an intensity of the third frequency spectrum and an intensity of the fourth frequency spectrum, and the transfer characteristic, and
     suppress the intensity of the fourth frequency spectrum using the specified suppression level.

2. The sound processing device according to claim 1, wherein the processor is configured to
   specify the suppression level of the intensity of the fourth frequency spectrum based on a third difference between the first difference and the second difference.

3. The sound processing device according to claim 2, wherein the processor is configured to specify the suppression level so that the suppression level increases when the third difference increases.

4. The sound processing device according to claim 2, wherein the processor is configured to
specify the suppression level so that the suppression level is reduced when the third difference is reduced.

5. The sound processing device according to claim 1, wherein the processor is configured to
smooth the suppression levels in bands of a plurality of frequencies of the fourth frequency spectrum.

6. The sound processing device according to claim 1, wherein the processor is configured to
smooth the suppression levels in a plurality of frames of the fourth sound signal.

7. The sound processing device according to claim 5, wherein the processor is configured to
suppress the intensity of the fourth frequency spectrum based on the smoothed suppression level.

8. The sound processing device according to claim 6, wherein the processor is configured to
suppress the intensity of the fourth frequency spectrum based on the smoothed suppression level.

9. A sound processing device configured to be coupled to a first input device, a second input device, and a third input device, the sound processing device comprising:
a memory; and
a processor coupled to the memory and configured to,
generate a first frequency spectrum of a first sound signal corresponding to a first sound received at the first input device, a second frequency spectrum of a second sound signal corresponding to the first sound received at the second input device, and a third frequency spectrum of a third sound signal corresponding to the first sound received at the third input device,
calculate transfer characteristics based on mutual differences between an intensity of the first frequency spectrum, an intensity of the second frequency spectrum, and an intensity of the third frequency spectrum,
specify a first suppression level, a second suppression level, and a third suppression level respectively applied to a fourth frequency spectrum of a fourth sound signal transmitted from the first input device, a fifth frequency spectrum of a fifth sound signal transmitted from the second input device, and a sixth frequency spectrum of a sixth sound signal transmitted from the third input device based on an intensity of the fourth frequency spectrum, an intensity of the fifth frequency spectrum, an intensity of the sixth frequency spectrum, and the transfer characteristics,
suppress the intensity of the fourth frequency spectrum using the first suppression level, suppress the intensity of the fifth frequency spectrum using the second suppression level, and suppress the intensity of the sixth frequency spectrum using the third suppression level.

10. A non-transitory computer-readable storage medium storing a program that causes an information processing apparatus to execute a process, the information processing apparatus being configured to be coupled to a first input device and a second input device, the process comprising:
generating a first frequency spectrum of a first sound signal corresponding to a first sound received at the first input device and a second frequency spectrum of a second sound signal corresponding to the first sound received at the second input device;
calculating a transfer characteristic based on a first difference between an intensity of the first frequency spectrum and an intensity of the second frequency spectrum;
generating a third frequency spectrum of a third sound signal transmitted from the first input device and a fourth frequency spectrum of a fourth sound signal transmitted from the second input device;
specifying a suppression level of an intensity of the fourth frequency spectrum based on a second difference between an intensity of the third frequency spectrum and an intensity of the fourth frequency spectrum, and the transfer characteristic; and
suppressing the intensity of the fourth frequency spectrum using the specified suppression level.

11. The non-transitory computer-readable storage medium according to claim 10, wherein
in the specifying, the suppression level of the intensity of the fourth frequency spectrum is specified based on a third difference between the first difference and the second difference.

12. The non-transitory computer-readable storage medium according to claim 11, wherein
in the specifying, the suppression level is specified so that the suppression level increases when the third difference increases.

13. The non-transitory computer-readable storage medium according to claim 11, wherein
in the specifying, the suppression level is specified so that the suppression level is reduced when the third difference is reduced.

14. The non-transitory computer-readable storage medium according to claim 10, the process further comprising:
smoothing the suppression levels in bands of a plurality of frequencies of the fourth frequency spectrum.

15. The non-transitory computer-readable storage medium according to claim 10, the process further comprising:
smoothing the suppression levels in a plurality of frames of the fourth sound signal.

16. The non-transitory computer-readable storage medium according to claim 14, wherein
in the suppressing, the intensity of the fourth frequency spectrum is suppressed based on the smoothed suppression level.

17. The non-transitory computer-readable storage medium according to claim 15, wherein
in the suppressing, the intensity of the fourth frequency spectrum is suppressed based on the smoothed suppression level.

* * * * *